US011211916B2

(12) United States Patent
Yoshida et al.

(10) Patent No.: US 11,211,916 B2
(45) Date of Patent: Dec. 28, 2021

(54) RESONANT TRANSDUCER

(71) Applicant: Yokogawa Electric Corporation, Tokyo (JP)

(72) Inventors: Takashi Yoshida, Tokyo (JP); Yusaku Yoshida, Tokyo (JP); Makoto Noro, Tokyo (JP); Atsushi Yumoto, Tokyo (JP); Shuhei Yoshita, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 422 days.

(21) Appl. No.: 15/814,481

(22) Filed: Nov. 16, 2017

(65) Prior Publication Data

US 2018/0145656 A1    May 24, 2018

(30) Foreign Application Priority Data

Nov. 21, 2016   (JP) .............................. JP2016-226251

(51) Int. Cl.
*H03H 9/24*    (2006.01)
*H03H 9/02*    (2006.01)

(52) U.S. Cl.
CPC ...... *H03H 9/2447* (2013.01); *H03H 9/02338* (2013.01); *H03H 2009/02291* (2013.01)

(58) Field of Classification Search
CPC ............ H03H 9/2447; H03H 9/02338; H03H 2009/02291; G01D 5/12; G01D 5/02
USPC ........................................................ 73/579
See application file for complete search history.

(56) References Cited

U.S. PATENT DOCUMENTS

| | | | | |
|---|---|---|---|---|
| 5,859,368 A | * | 1/1999 | Cargille | G01C 19/5656 73/504.15 |
| 2002/0017134 A1 | * | 2/2002 | Sakurai | G01P 15/0802 73/504.02 |
| 2002/0078746 A1 | * | 6/2002 | Mochida | G01C 19/5719 73/504.12 |
| 2002/0145489 A1 | * | 10/2002 | Cornett | H03H 3/0072 333/197 |
| 2003/0117237 A1 | * | 6/2003 | Niu | H03H 9/02338 333/187 |
| 2003/0184412 A1 | * | 10/2003 | Gorrell | H03H 3/0077 333/186 |
| 2012/0060607 A1 | | 3/2012 | Yoshida | |
| 2012/0067125 A1 | * | 3/2012 | Nakanishi | G01L 1/162 73/579 |
| 2012/0206018 A1 | * | 8/2012 | Kawakubo | H03H 9/172 310/344 |

(Continued)

FOREIGN PATENT DOCUMENTS

| | | |
|---|---|---|
| JP | 1-127929 A | 5/1989 |
| JP | 5158160 B2 | 3/2013 |
| JP | 5429696 B2 | 2/2014 |

*Primary Examiner* — Marrit Eyassu
(74) *Attorney, Agent, or Firm* — Sughrue Mion, PLLC

(57) ABSTRACT

A resonant transducer includes a resonant beam which is formed on a semiconductor substrate, a support beam of which one end is connected to a part of the resonant beam at a predetermined angle, a first electrode which is connected to the resonant beam via the support beam, a second electrode which is disposed adjacent to a center of one side surface of the resonant beam, and a conductor which is disposed between the support beam and the second electrode, the conductor being connected to the first electrode.

20 Claims, 6 Drawing Sheets

(56) References Cited

U.S. PATENT DOCUMENTS

| | | | | |
|---|---|---|---|---|
| 2013/0139377 | A1* | 6/2013 | Noda | H04R 31/00 29/594 |
| 2014/0076024 | A1* | 3/2014 | Duraffourg | G01N 25/18 73/23.4 |
| 2014/0111919 | A1* | 4/2014 | Miyasaka | H01L 41/23 361/679.01 |
| 2014/0298908 | A1* | 10/2014 | Ichikawa | G01P 3/16 73/504.12 |
| 2015/0285634 | A1* | 10/2015 | Watanabe | G01C 19/5733 73/504.12 |
| 2017/0217764 | A1* | 8/2017 | Li | B81B 7/02 |

\* cited by examiner

RESONANT TRANSDUCER

BACKGROUND

Technical Fields

The disclosure relates to an electrostatic drive resonant transducer which is formed on a semiconductor substrate.

Priority is claimed on Japanese Patent Application No. 2016-226251, filed on Nov. 21, 2016, the contents of which are incorporated herein by reference.

Related Art

In a resonant transducer, an inside of a semiconductor substrate, for example, a silicon wafer is provided with a vacuum chamber in which a vacuum is maintained, a fine resonant beam (a resonator) which is disposed inside the vacuum chamber, and a resonant detector for detecting the resonance of the resonant beam (for example, refer to Japanese Patent No. 5158160).

In a case in which the resonant transducer is used in a high-pressure environment, for example, a compressive strain is applied to the resonant beam, and there is a concern that the resonant beam will buckle. When the resonant beam buckles, the resonant beam no longer stably resonates. Accordingly, usage is difficult under high pressure.

On the other hand, Japanese Patent No. 5429696 discloses a resonant transducer in which impurities are diffused in the resonant beam, and a high tension is applied to the resonant beam. By applying high tension to the resonant beam, even if the resonant beam is used in a high-pressure environment, it is possible to suppress the buckling of the resonant beam.

Japanese Unexamined Patent Application No. H01-127929 discloses a resonant differential pressure sensor which is capable of eliminating the influence of a compressive strain which is applied to the resonant beam by static pressure due to support beams extending from the end parts of the resonant beam to both sides being formed and the whole being formed in an arrow shape.

However, as in the resonant transducer which is described in Japanese Patent No. 5429696, there is a limit to the degree to which impurities are diffused in the resonant beam and the tension is improved, and the resilience of the resonant beam to buckling is limited. There is also a problem in which laborious manufacturing processes such as diffusing impurities in the resonant beam is necessary, and the manufacturing cost increases.

In the resonant differential pressure sensor which is described in Japanese Unexamined Patent Application No. H01-127929, a peripheral region of the resonant beam is spread out as a space, and the resonant beam is caused to resonate using magnetism. In this configuration, the resonant beam may not be excited by an electrostatic force, and the configuration may not be applied to an electrostatic drive resonant transducer. There is a problem in that when the resonant differential pressure sensor which is described in Japanese Unexamined Patent Application No. H01-127929 is to be caused to operate by electrostatic driving, electrostatic attraction arises between the support beams and the electrodes of the electrostatic drive, and fluctuation in the resonance of the resonant beam increases.

SUMMARY

A resonant transducer may include a resonant beam which is formed on a semiconductor substrate, a support beam of which one end is connected to a part of the resonant beam at a predetermined angle, a first electrode which is connected to the resonant beam via the support beam, a second electrode which is disposed adjacent to a center of one side surface of the resonant beam, and a conductor which is disposed between the support beam and the second electrode, the conductor being connected to the first electrode.

Further features and aspects of the present disclosure will become apparent from the following detailed description of exemplary embodiments with reference to the attached drawings.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide an electrostatic drive resonant transducer which is capable of preventing the resonant beam from buckling due to the compressive strain on the resonant beam, and is capable of detecting stress with high precision using the stable resonance of the resonant beam.

Hereinafter, a description will be given of the resonant transducer of the first embodiment of the present invention with reference to the drawings. Specific description will be given of each of the embodiments in order to further improve understanding of the gist of the invention, and this does not limit the present invention as long as no indication is particularly given. With regard to the drawings which are used in the following description, in order to facilitate understanding of the characteristics of the present invention, there are cases in which main parts are illustrated in an enlarged manner for convenience, and the dimensional aspect ratios and the like of the constituent elements are not necessarily the same as in actuality.

First Embodiment

Figure 1:
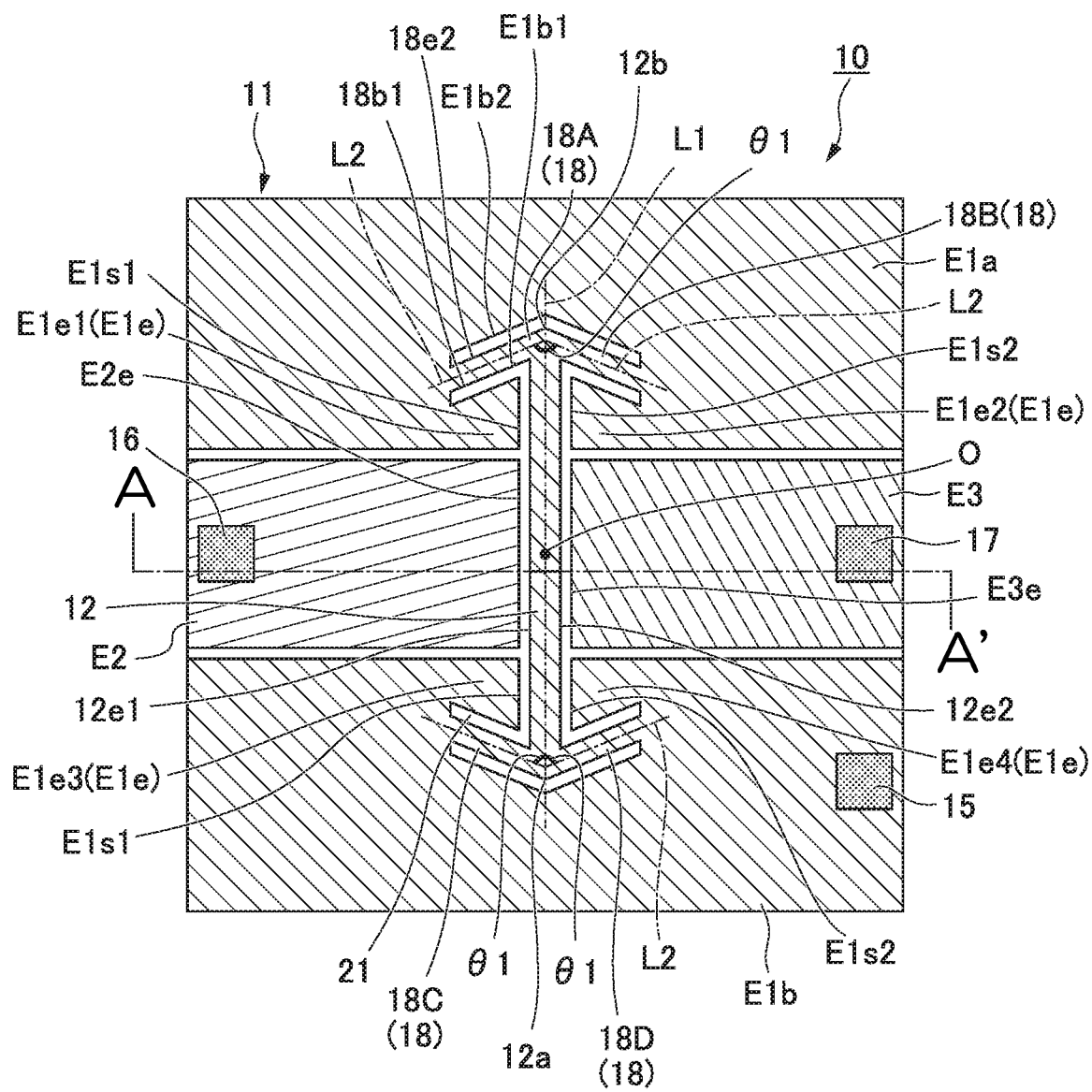
FIG. 1 is a plan view illustrating a resonant beam area of a resonant transducer of a first embodiment of the present invention.
Figure 2:
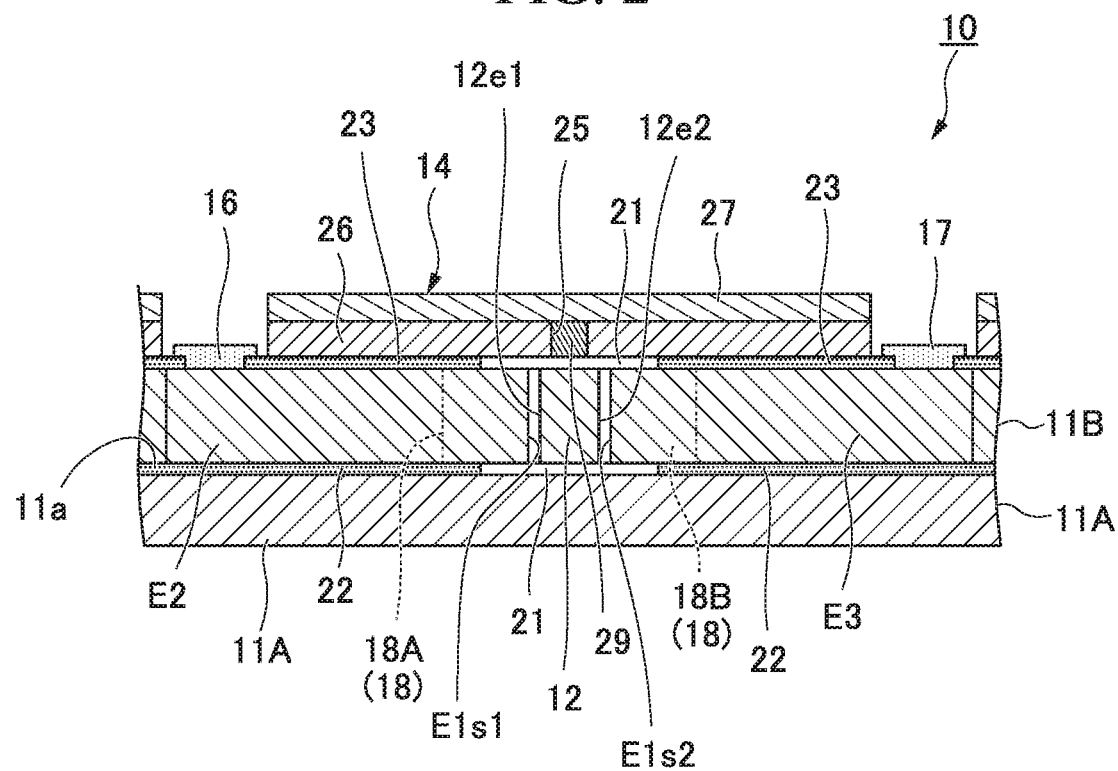
FIG. 2 is a sectional diagram along a thickness direction of an A-A' line of the embodiment illustrated in FIG. 1.
Figure 3:
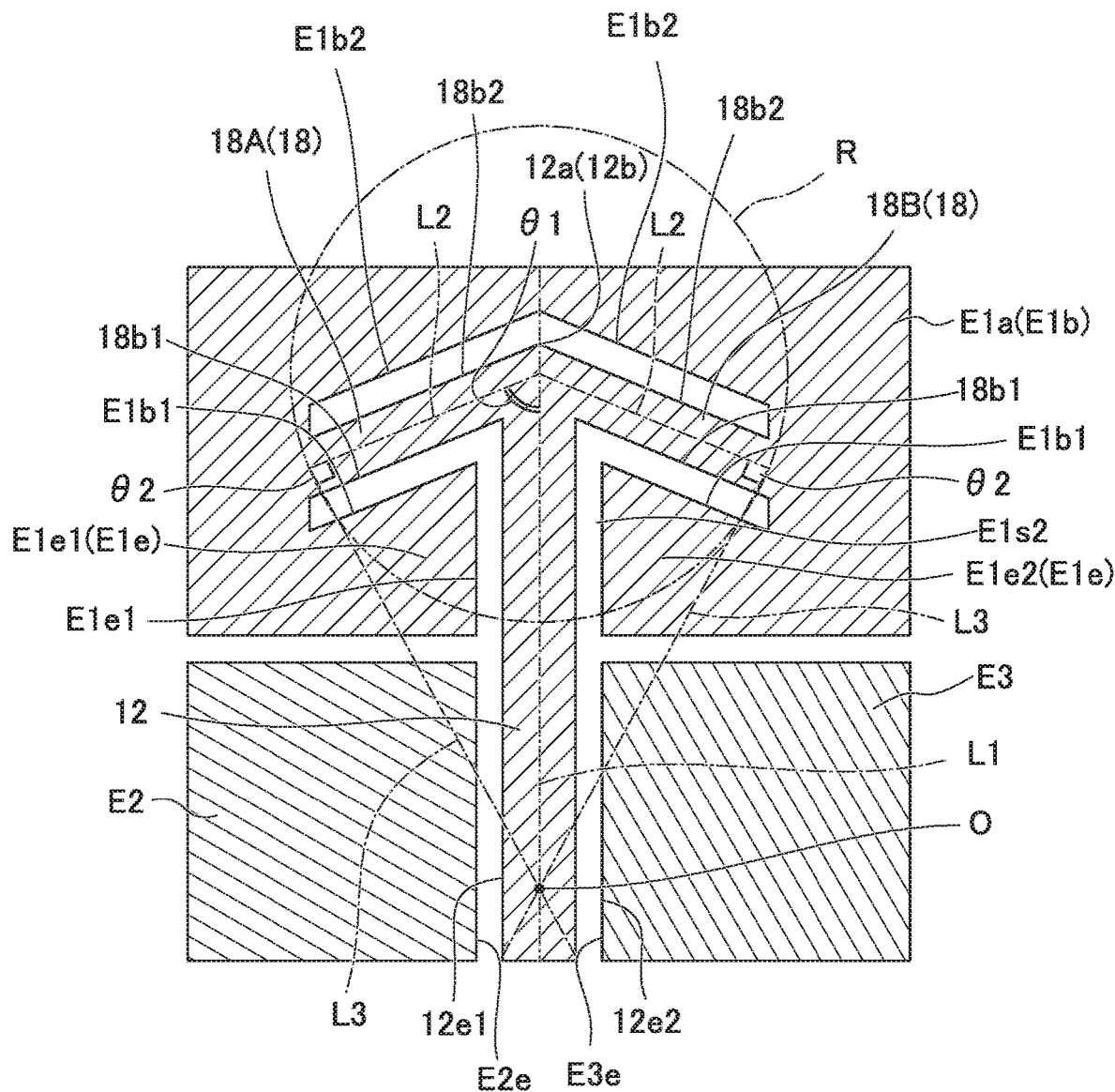
FIG. 3 is an enlarged plan view of a main part in which a vicinity of the resonant beam of the embodiment illustrated in FIG. 1 is enlarged.

FIG. 1 is a plan view illustrating a shell of the resonant transducer of the present invention as viewed from above, excluding the shell. FIG. 2 is a sectional diagram along the thickness direction of the A-A' line in FIG. 1. FIG. 3 is an enlarged plan view of a main part in which the vicinity of the resonant beam in FIG. 1 is enlarged.

A description will be given of the configuration of the first embodiment which is illustrated in FIG. 1. The characteristics of the first embodiment of FIG. 1 are in conductors E1e. The conductors E1e include a first part conductor E1e1, a second part conductor E1e2, a third part conductor E1e3, and a fourth part conductor E1e4.

A resonant beam 12 is formed to be narrow and long. The resonant beam 12 is formed to be symmetrical around a center O thereof. Support beams 18 are connected to the resonant beam 12. The support beams 18 include a first support beam 18A, a second support beam 18B, a third support beam 18C, and a fourth support beam 18D.

One end of the third support beam 18C is connected to one end 12a of the resonant beam 12. One end of the fourth support beam 18D is connected to the one end 12a of the resonant beam 12. One end of the first support beam 18A is connected to the other end 12b of the resonant beam 12. One end of the second support beam 18B is connected to the other end 12b of the resonant beam 12.

The other end of the third support beam 18C is connected to a first electrode E1b of the other side. The other end of the fourth support beam 18D is connected to the first electrode E1b of the other side. The other end of the first support beam 18A is connected to the first electrode E1a of the one side. The other end of the second support beam 18B is connected to the first electrode E1a of the one side.

Therefore, the first electrode E1a of the one side and the first electrode E1b of the other side are connected via the first support beam 18A, the second support beam 18B, the resonant beam 12, the third support beam 18C, and the fourth support beam 18D. The first electrode E1a of the one side, the first electrode E1b of the other side, the first support beam 18A, the second support beam 18B, the resonant beam 12, the third support beam 18C, and the fourth support beam 18D have the same electrical potential.

The first electrode E1a of the one side and the first electrode E1b of the other side are connected to a first electrode terminal 15.

A longitudinal direction L1 of the resonant beam 12 and the first support beam 18A form an angle $\theta 1$ (for example, an interior angle of approximately 80°). The longitudinal direction L1 of the resonant beam 12 and the second support beam 18B form the angle $\theta 1$. The longitudinal direction L1 of the resonant beam 12 and the third support beam 18C form the angle $\theta 1$. The longitudinal direction L1 of the resonant beam 12 and the fourth support beam 18D form the angle $\theta 1$.

A second electrode E2 is formed adjacent to one side surface 12e1 of the resonant beam 12. The second electrode E2 is connected to a second electrode terminal 16. A third electrode E3 is formed adjacent to the other side surface 12e2 of the resonant beam 12. The third electrode E3 is connected to a third electrode terminal 17. The second electrode E2 and the third electrode E3 are formed to be adjacent via the resonant beam 12.

The first support beam 18A and the third support beam 18C are formed on the one side surface 12e1 of the resonant beam 12. The second support beam 18B and the fourth support beam 18D are formed on the other side surface 12e2 of the resonant beam 12.

By adjusting the angle $\theta 1$, it is possible to control the pressure strain which is applied to the resonant beam 12 from the support beams 18 in a range of, for example, 1 to 1/500. In particular, in a case in which the resonant beam 12 is to be used for the purpose of a pressure gage, it is appropriate to adjust the angle $\theta 1$ according to the pressure range to be used. When the angle $\theta 1$ is widened to reduce the transmission amount of the pressure strain, although buckling occurs less easily, the pressure sensitivity is worsened. By controlling the transmission amount of the pressure strain to a degree at which buckling does not occur by adjusting the angle $\theta 1$, it is possible to realize a pressure sensor which utilizes the physical properties of silicon to the maximum extent.

The first part conductor E1e1 is formed to surround the second electrode E2, the first support beam 18A, and the resonant beam 12, and the first part conductor E1e1 is connected to the first electrode E1a of the one side. The second part conductor E1e2 is formed to surround the third electrode E3, the second support beam 18B, and the resonant beam 12, and the second part conductor E1e2 is connected to the first electrode E1a of the one side. The third part conductor E1e3 is formed to surround the second electrode E2, the third support beam 18C, and the resonant beam 12, and the third part conductor E1e3 is connected to the first electrode E1b of the other side. The fourth part conductor E1e4 is formed to surround the third electrode E3, the fourth support beam 18D, and the resonant beam 12, and the fourth part conductor E1e4 is connected to the first electrode E1b of the other side.

Through these configurations, the force which is generated between the first support beam 18A and the second electrode E2 is suppressed, and the operation of the resonant beam 12 is stabilized. The force which is generated between the second support beam 18B and the third electrode E3 is suppressed, and the operation of the resonant beam 12 is stabilized. The force which is generated between the third support beam 18C and the second electrode E2 is suppressed, and the operation of the resonant beam 12 is stabilized. The force which is generated between the fourth support beam 18D and the third electrode E3 is suppressed, and the operation of the resonant beam 12 is stabilized.

The first part conductor E1e1 and the third part conductor E1e3 are respectively provided with parts E1s1 which are adjacent to the one side surface 12e1 of the resonant beam 12 and are parallel. The second part conductor E1e2 and the fourth part conductor E1e4 are respectively provided with parts E1s2 which are adjacent to the other side surface 12e2 of the resonant beam 12 and are parallel.

The first part conductor E1e1 is provided with a part E1b1 which is adjacent and parallel to one side surface 18b1 of the first support beam 18A. The second part conductor E1e2 is provided with a part which is adjacent and parallel to the one side surface of the second support beam 18B. The third part conductor E1e3 is provided with a part which is adjacent and parallel to the one side surface of the third support beam 18C. The fourth part conductor E1e4 is provided with a part which is adjacent and parallel to the one side surface of the fourth support beam 18D.

Through these configurations, the force which is generated between the first support beam 18A and the second electrode E2 is minimized, and the operation of the resonant beam 12 is stabilized. The force which is generated between the second support beam 18B and the third electrode E3 is minimized, and the operation of the resonant beam 12 is stabilized. The force which is generated between the third support beam 18C and the second electrode E2 is minimized, and the operation of the resonant beam 12 is stabilized. The force which is generated between the fourth support beam 18D and the third electrode E3 is minimized, and the operation of the resonant beam 12 is stabilized.

The second electrode E2 includes a part E2e which is parallel to the one side surface 12e1 of the resonant beam 12. The third electrode E3 includes a part E3e which is parallel to the other side surface 12e2 of the resonant beam 12. The second electrode E2 and the third electrode E3 are disposed to interpose the resonant beam 12 from both sides in the longitudinal direction L1 and to maintain a predetermined gap with respect to the resonant beam 12.

A description will be given of FIG. 2.

A resonant transducer 10 which is the first embodiment of the present invention is provided with, for example, a semiconductor substrate 11A which is formed of a silicon single crystal wafer. A silicon single crystal layer 11B, for example, is formed on one surface (a main surface) 11a of the semiconductor substrate 11A. The silicon single crystal layer 11B is configured of, for example, a low-resistance P-type semiconductor which is doped with boron. The silicon single crystal layer 11B is formed epitaxially or by bonding.

A shell 14 is formed to overlap the silicon single crystal layer 11B.

A vacuum chamber 21 which is partitioned into a predetermined shape is formed on the one surface 11a of the semiconductor substrate 11A, and the resonant beam (a resonator) 12 is formed inside the vacuum chamber 21. The resonant beam 12 is formed to extend, in a narrow and long manner, along the intra-surface direction of the one surface 11a of the semiconductor substrate 11A. A cross section of the resonant beam 12 which is perpendicular to the semiconductor substrate 11A is larger than a cross section which is parallel to the semiconductor substrate 11A. In a case that the longitudinal width of the resonant beam 12 is at least three times longer than the lateral width of the resonant beam 12, favorable characteristics may be obtained. In the present embodiment, the longitudinal direction L1 of the resonant beam 12 passes between the second electrode E2 and the third electrode E3.

According to this configuration, the resonant beam 12 and the support beams 18 thereof are formed to assume an overall shape of a double-headed arrow as in the embodiment of FIG. 1 when the resonant transducer 10 is viewed in a plan view from the shell 14 side.

Predetermined gaps are formed in a first electrode E1, the second electrode E2, and the third electrode E3 so as to surround the periphery of the resonant beam 12 and the respective support beams 18, and the vacuum chamber 21 is formed by the gaps.

It is preferable that impurities be diffused in the resonant beam 12 which is formed in the silicon single crystal layer 11B and the respective support beams 18. For example, by doping the resonant beam 12 and the respective support beams 18 with a specific element, it is possible to cause the impurities to diffuse. The diffusion of the impurities gives high tension characteristics to the resonant beam 12 and the respective support beams 18.

The shell 14 is configured, in order from the vacuum chamber 21, of a first layer 26 and a second layer 27 which is arranged to overlap the first layer 26. The first layer 26 and the second layer 27 are formed of any of a polysilicon, an amorphous silicon, SiC, SiGe, and Ge, for example.

A through hole 25 is formed in an area at which the first layer 26 overlaps the vacuum chamber 21. For example, the through hole 25 is formed in the first layer 26 immediately above the resonant beam 12. The through hole 25 is an opening through which an inflow and an outflow of an etching liquid which is used for forming the gap which configures the vacuum chamber 21. The through hole 25 is blocked by a blocking member 29.

An insulating layer 22 is formed between the semiconductor substrate 11A and the silicon single crystal layer 11B at an area excluding the vacuum chamber 21. An insulating layer 23 is formed between the silicon single crystal layer 11B and the shell 14 at an area excluding the vacuum chamber 21. The insulating layer 22 is formed by an SOT substrate.

The inside of the vacuum chamber 21 is maintained at a predetermined vacuum degree. The resonant beam 12 and the respective support beams 18 are disposed maintaining a predetermined interval with respect to the members which partition the vacuum chamber 21, that is, the semiconductor substrate 11A, the silicon single crystal layer 11B, and the shell 14.

According to FIG. 3, an angle θ2 formed by a direction L2 from one end of the support beams 18 toward the other end of the support beams 18 and a direction L3 from the center O of the resonant beam 12 in the longitudinal direction toward the other end of the support beams 18 is substantially a right angle. The resonant transducer 10 of the present invention may be used as a thermometer, for example.

The angle θ2 formed by the direction L2 from one end of the first support beam 18A toward the other end of the first support beam 18A and the direction L3 from the center O of the resonant beam 12 in the longitudinal direction toward the other end of the first support beam 18A is substantially a right angle. The angle θ2 formed by a direction from one end of the second support beam 18B toward the other end of the second support beam 18B and a direction from the center O of the resonant beam 12 in the longitudinal direction toward the other end of the second support beam 18B is substantially a right angle.

The angle θ2 formed by a direction from one end of the third support beam 18C toward the other end of the third support beam 18C and a direction from the center O of the resonant beam 12 in the longitudinal direction toward the other end of the third support beam 18C is substantially a right angle (not illustrated). The angle θ2 formed by a direction from one end of the fourth support beam 18D toward the other end of the fourth support beam 18D and a direction from the center O of the resonant beam 12 in the longitudinal direction toward the other end of the fourth support beam 18D is substantially a right angle (not illustrated).

A description will be given of the operational effects of the resonant transducer 10 of the first embodiment which is illustrated in FIGS. 1 to 3.

In a case in which the temperature changes, a stress is applied to the elements of the resonant transducer 10 such that the elements are displaced toward the center O of the resonant beam 12. The other end of the first support beam 18A and the other end of the second support beam 18B are displaced on a tangential line of a virtual circle R which is centered on the other end 12b of the resonant beam 12. The other end of the third support beam 18C and the other end of the fourth support beam 18D are displaced on a tangential line of a virtual circle which is centered on the one end 12a of the resonant beam 12 (not illustrated).

The stress of the other end 12b of the resonant beam 12 heading toward the center O cancels the stress which is generated between the one end of the first support beam 18A and the one end of the second support beam 18B, and the other end 12b of the resonant beam 12 is not displaced. The stress of the one end 12a of the resonant beam 12 heading toward the center O cancels the stress which is generated between the one end of the third support beam 18C and the one end of the fourth support beam 18D, and the one end 12a of the resonant beam 12 is not displaced.

Therefore, according to the resonant transducer 10 of the first embodiment, the stress (pressure and the like) from the outside is not significantly transmitted to the resonant beam. The resonance (the frequency variation) of the resonant beam is determined by the temperature dependency of the spring coefficient (Young's modulus). Accordingly, the resonant transducer 10 of the first embodiment may be applied favorably for the purpose of a thermometer.

Figure 4:
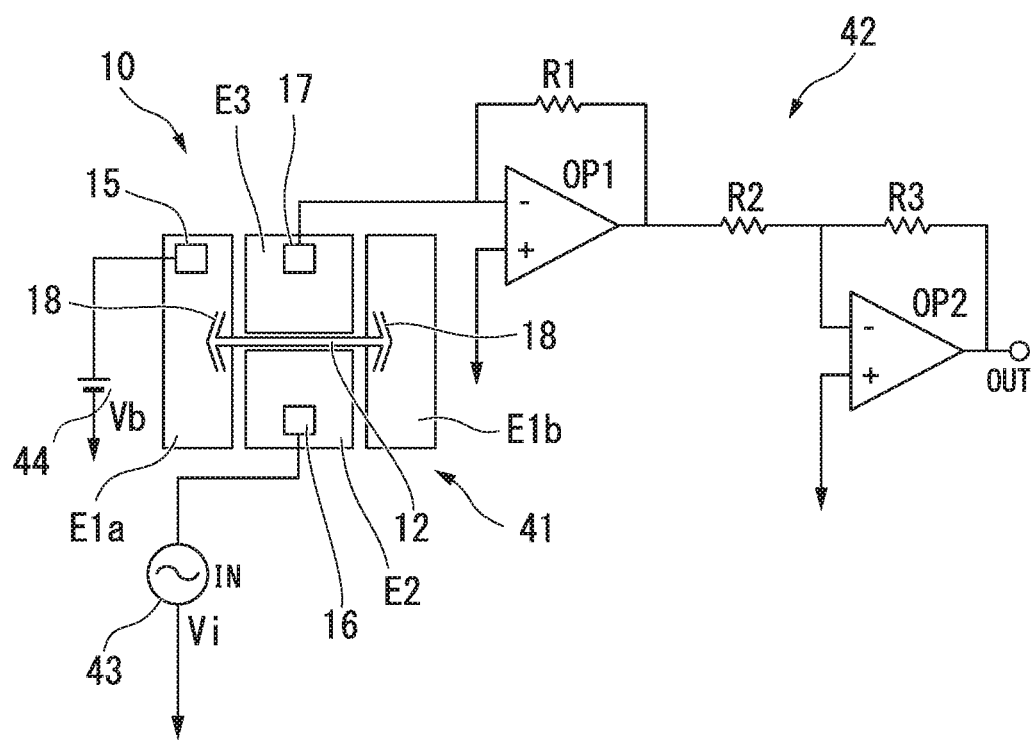
FIG. 4 is a circuit diagram illustrating a circuit configuration of the resonant transducer of the present invention.

FIG. 4 is a circuit diagram illustrating an outline of the circuit of the resonant transducer.

In FIG. 4, configurations which are similar to those in FIGS. 1 to 3 will be assigned the same numbers, and detailed description thereof will not be repeated.

The resonant transducer 10 includes an exciter (a drive circuit) 41 for exciting the resonant beam 12 and a resonant detector 42 for detecting the resonance of the resonant beam 12. The exciter 41 is provided with a drive power source 43.

The resonant detector 42 is configured of the drive power source 43, a bias power supply 44, resistances R1, R2, and R3, operational amplifiers (op-amps) OP1, OP2, and the like.

The bias power supply 44 is connected to the first electrode terminal 15, and the first electrode terminal 15 is grounded to a stable potential via the bias power supply 44. The second electrode terminal 16 is connected to the drive power source 43. The third electrode terminal 17 is connected to the resonant detector 42.

A description will be given of the operations of the circuit of the resonant transducer which is illustrated in FIG. 4.

An alternating current voltage of a predetermined drive voltage Vi is applied from the drive power source 43. A direct current voltage of a predetermined bias voltage Vb is applied from the bias power supply 44. The bias voltage Vb of a predetermined voltage is applied to the first electrodes E1a and E1b from the bias power supply 44 via the first electrode terminal 15. The drive voltage Vi of an alternating current is applied to the second electrode E2 from the drive power source 43 via the second electrode terminal 16. A detection signal corresponding to the resonant frequency of the resonant beam 12 is extracted from the third electrode E3 via the third electrode terminal 17.

When the bias voltage Vb of a predetermined voltage is applied to the first electrodes E1a and E1b, and the drive voltage Vi of an alternating current is applied to the second electrode E2, an electrostatic attraction is generated between the resonant beam 12 which becomes the same potential as the first electrodes E1a and E1b and the second electrode E2, and the resonant beam 12 resonates at a fixed resonant frequency along the intra-surface direction of the one surface 11a of the semiconductor substrate 11A.

On the other hand, a charge is stored by the bias voltage Vb which is applied to the first electrodes E1a and E1b between the resonant beam 12 which becomes the same potential as the first electrodes E1a and E1b and the third electrode E3. When the resonant beam 12 resonates to change the electrostatic capacity between the resonant beam 12 and the third electrode E3, a detection signal which is an alternating current corresponding to the change is generated. The detection signal is amplified by the operational amplifiers OP1 and OP2, and the resonant frequency of the resonant beam 12 is measured by reading the voltage change using a counter.

When stress is applied to the resonant beam 12 and strain is generated, the resonant frequency of the resonant beam 12 fluctuates according to the amount of the strain. It is possible to measure the amount of the strain of the resonant beam 12 (in other words, the stress which is applied to the resonant beam 12) by referring to the relationship between the fluctuation amount of the resonant frequency of the resonant beam 12 and the amount of the strain of the resonant beam 12. The stress which is applied to the resonant beam 12 is generated by pressure, acceleration, strain, temperature, and the like.

In this configuration, it is possible to separate the second electrode E2 which serves as the excitation electrode and the third electrode E3 which serves as the detection electrode. For this reason, since the parasitic capacitance between the second electrode E2 and the third electrode E3 is reduced, cross talk in which the drive voltage Vi goes around to the detection circuit side is suppressed, and the SN ratio is improved.

By forming the conductors E1e (the first part conductor E1e1, the second part conductor E1e2, the third part conductor E1e3, and the fourth part conductor E1e4) which is a part of the first electrodes E1a and E1b respectively between the support beams 18A, 18B, 18C, and 18D which support the resonant beam 12 and the second electrode E2 and the third electrode E3, the periphery of the support beams 18A, 18B, 18C, and 18D assumes the same potential as the first electrodes E1a and E1b.

Accordingly, the electrostatic attraction between the first support beam 18A and the second electrode E2 is cut off, the electrostatic attraction between the second support beam 18B and the third electrode E3 is cut off, the electrostatic attraction between the third support beam 18C and the second electrode E2 is cut off, the electrostatic attraction between the fourth support beam 18D and the third electrode E3 is cut off, and it is possible to stabilize the operation of the resonant beam 12. Accordingly, the resonant beam 12 does not generate a different resonance from the original resonance mode. It is possible to realize a resonant transducer which is capable of detecting physical stress with high precision.

In a case in which the resonant transducer 10 is used in a high-pressure environment, for example, a large compressive strain is applied to the semiconductor substrate 11A. However, since the resonant beam 12 is connected to the first electrode E1 via the support beams 18A, 18B, 18C, and 18D which are formed to fork into two at the respective one ends 12a and other ends 12b, it is possible to reduce the compressive strain which is applied to the resonant beam 12.

In a case in which the resonant beam 12 is used in a high-pressure environment, buckling of the resonant beam 12 is suppressed, and the resonant beam 12 resonates stably according to an action based on the configuration of the resonant transducer 10 of the present invention. Accordingly, even in a high-pressure environment, the resonant beam 12 is capable of stably resonating without buckling, and it is possible to realize the resonant transducer 10 which is capable of detecting physical stress with high precision.

As described above, according to the resonant transducer 10 of the present invention, it is possible to provide an electrostatic drive resonant transducer which is capable of detecting stress with high precision due to the stable resonance of the resonant beam.

Second Embodiment

Figure 5:
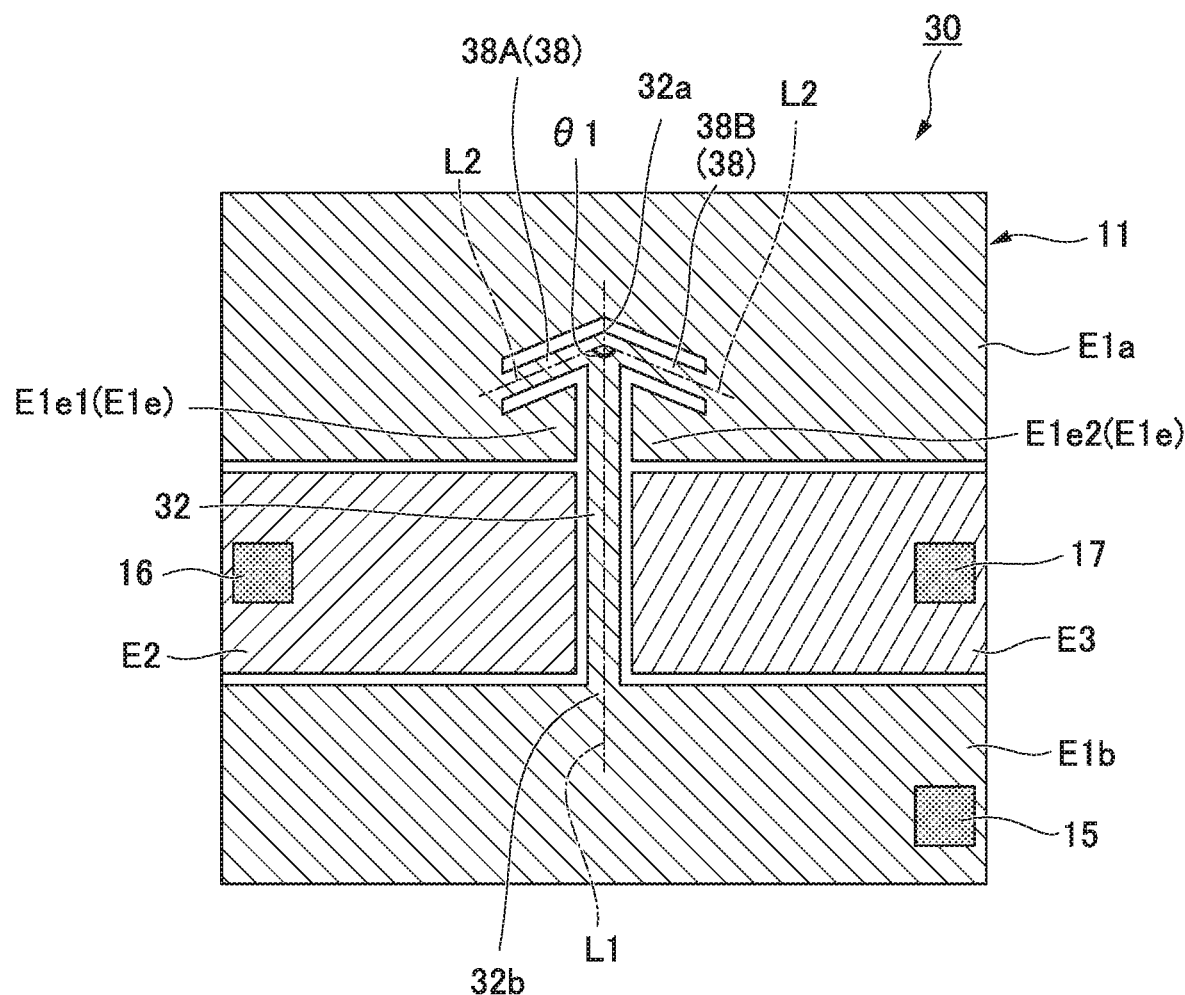
FIG. 5 is a plan view illustrating a resonant beam area of a resonant transducer of a second embodiment of the present invention.

FIG. 5 is a plan view illustrating a resonant beam area of a resonant transducer of a second embodiment of the present invention. Configurations which are similar to those of the first embodiment will be assigned the same numbers, and detailed description thereof will not be repeated. The characteristics of the second embodiment which is illustrated in FIG. 5 are in the point in which the shape of the resonant beam is formed asymmetrically in comparison to the first embodiment which is illustrated in FIG. 1. Hereinafter, a description will be given of the configuration of the second embodiment which is illustrated in FIG. 5.

In a resonant transducer 30 of the second embodiment, support beams 38 (a first support beam 38A and a second support beam 38B) are formed only on one end 32a of a resonant beam 32, and other end 32b of the resonant beam 32 is directly connected to the first electrode E1b.

Even in the resonant transducer 30 of this configuration, the first part conductor E1e1 of the conductors E1e which is a part of the first electrode E1a is formed between the first support beam 38A which supports the one end 32a of the resonant beam 32 and the second electrode E2, and the second part conductor E1e2 of the conductor E1e is formed between the second support beam 38B and the third electrode E3.

A description will be given of the operational effects of the resonant transducer of the second embodiment which is illustrated in FIG. 5.

According to these configurations, the electrostatic attraction between the second electrode E2 and the third electrode E3 is cut off, and it is possible to stabilize the operation of the resonant beam 32. Accordingly, the resonant beam 32 does not generate a different resonance from the original resonance mode. Accordingly, it is possible to realize a resonant transducer which is capable of detecting physical stress with high precision.

As in the present embodiment, by forming the support beams 38 which support the resonant beam 32 only on the one end 32a of the resonant beam 32, it is possible to reduce the reduction amount of the strain, and it is possible to increase the detection precision of the stress which is applied.

Third Embodiment

Figure 6:
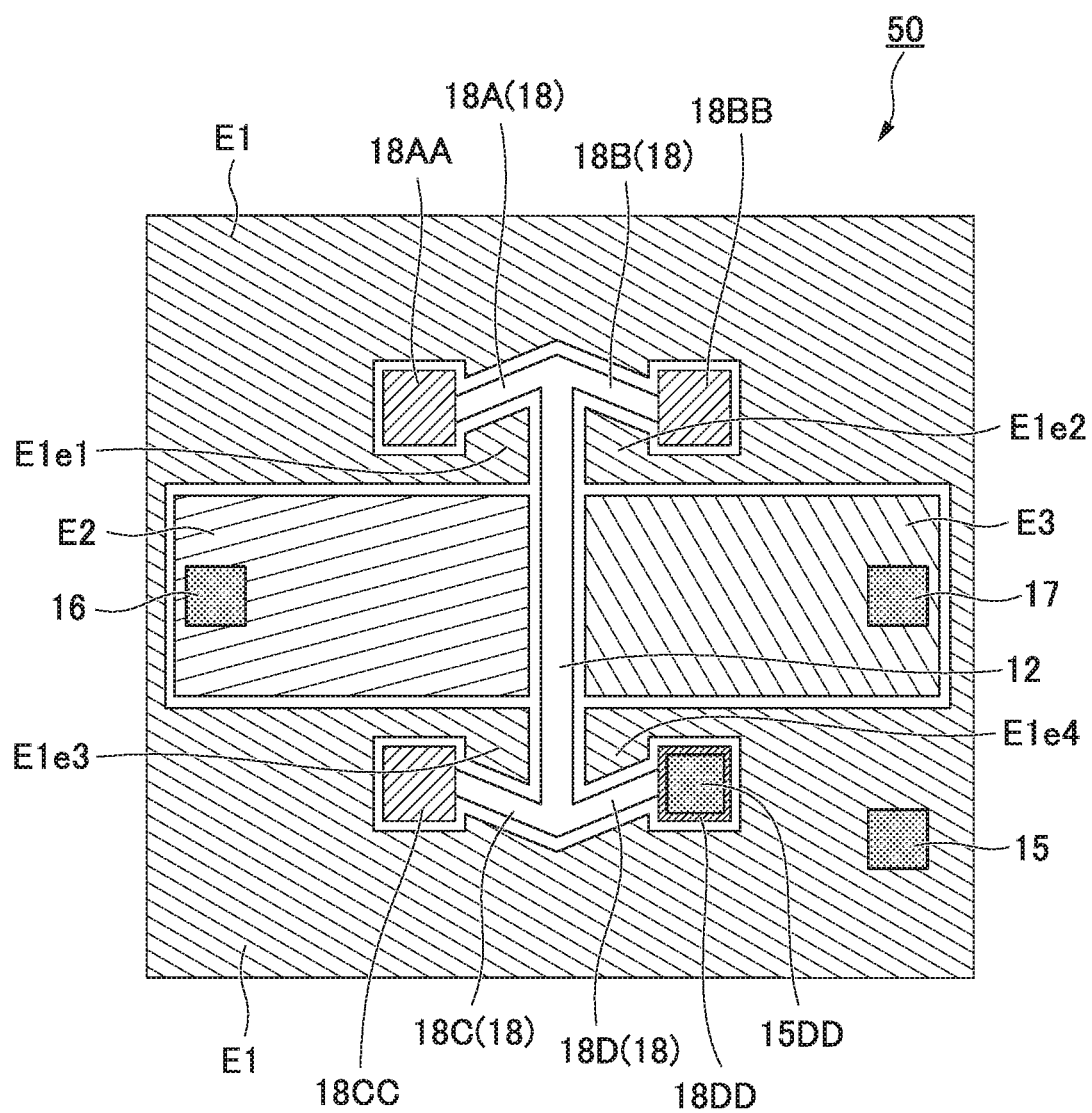
FIG. 6 is a plan view illustrating a resonant beam area of a resonant transducer of a third embodiment of the present invention.

FIG. 6 is a plan view illustrating a resonant beam area of a resonant transducer of a third embodiment of the present invention. The characteristics of a resonant transducer 50 of the third embodiment which is illustrated in FIG. 6 are in the point in which the conductor is grounded in comparison to the resonant transducer of the first embodiment which is illustrated in FIG. 1. Configurations which are similar to those of the first embodiment will be assigned the same numbers, and detailed description thereof will not be repeated.

The other end of the third support beam 18C is connected to a pad 18CC. The other end of the fourth support beam 18D is connected to a pad 18DD. The other end of the first support beam 18A is connected to a pad 18AA. The other end of the second support beam 18B is connected to a pad 18BB. The pad 18DD is connected to an electrode terminal 15DD. The electrode terminal 15DD is connected to the bias power supply 44 which is illustrated in FIG. 4, and the electrode terminal 15DD is grounded to a stable potential body which is set to a stable potential via the bias power supply 44 (not illustrated).

Therefore, the pad 18AA, the first support beam 18A, the pad 18BB, the second support beam 18B, the resonant beam 12, the pad 18CC, the third support beam 18C, the pad 18DD, the fourth support beam 18D, and the electrode terminal 15DD are the same electrical potential as each other.

The first electrode E1 is formed to surround the pad 18AA, the first support beam 18A, the pad 18BB, the second support beam 18B, the pad 18CC, the third support beam 18C, the pad 18DD, the fourth support beam 18D, the second electrode E2, and the third electrode E3. The first part conductor E1e1, the second part conductor E1e2, the third part conductor E1e3, and the fourth part conductor E1e4 are respectively connected to the first electrode E1. The first electrode E1 is connected to the first electrode terminal 15.

A description will be given of the operations and effects of the resonant transducer of the third embodiment which is illustrated in FIG. 6.

According to the resonant transducer 50 of the third embodiment, in the same manner as in the resonant transducer 10 of the first embodiment, the force which is generated between the first support beam 18A and the second electrode E2 the force which is generated between the second support beam 18B and the third electrode E3, the force which is generated between the third support beam 18C and the second electrode E2, and the force which is generated between the fourth support beam 18D and the third electrode E3 are respectively suppressed. Accordingly, it is possible to stabilize the operation of the resonant beam 12.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, in the above-described embodiments, an example is given of forming a plurality of conductors (regions) between the plurality of support beams which support the resonant beam and the respective support beams, second electrodes, and third electrodes; however, a configuration in which a single conductor of the same potential as the support beam is formed between at least one of the support beams and an electrode of a different potential from the support beam.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A resonant transducer comprising:
   a resonant beam which is formed on a semiconductor substrate, both ends of the resonant beam being supported;
   a support beam of which one end is connected to a part of the resonant beam at a predetermined angle;
   a first electrode which is connected to the resonant beam via the support beam;
   a second electrode which is disposed adjacent to a center of one side surface of the resonant beam; and
   a conductor which is disposed between the support beam and the second electrode, the conductor being connected to the first electrode,
   wherein a longitudinal direction of the resonant beam and a longitudinal direction of the support beam form an acute angle or an obtuse angle,
   wherein a vertical length of the resonant beam is longer than a horizontal length of the resonant beam, both ends of the resonant beam are supported, and the resonant beam resonates along an intra-surface direction of the semiconductor substrate,
   wherein the support beam comprises:
      a first support beam of which one end is connected to one side surface of one end of the resonant beam at a predetermined angle, another end of the first support beam being connected to the semiconductor substrate at a predetermined angle; and
      a second support beam of which one end is connected to another side surface of the one end of the resonant beam at a predetermined angle, and
   wherein a first connection point at which the first support beam is connected to the semiconductor substrate, a second connection point at which the second support beam is connected to the semiconductor substrate, and a third connection point at which the first support beam and the second support beam are connected to the resonant beam are not aligned in a straight line.

2. The resonant transducer according to claim 1, wherein the conductor is formed to surround the support beam.

3. The resonant transducer according to claim 1, wherein the conductor comprises:
   a part which is parallel to one side surface of the support beam; and
   a part which is parallel to the other side surface of the support beam.

4. The resonant transducer according to claim 1, wherein the conductor comprises a part which is parallel to the one side surface of the resonant beam.

5. The resonant transducer according to claim 1,
   wherein an angle which is formed by a direction heading from the one end of the support beam toward another end and a direction heading from a center of the resonant beam in a longitudinal direction toward the other end of the support beam is substantially a right angle, and resonance of the resonant beam is detected, where the resonance is based on temperature.

6. The resonant transducer according to claim 1,
   wherein a third electrode is formed adjacent to a center of the other side surface of the resonant beam, and
   wherein the conductor comprises:
      a first part conductor which is disposed between the support beam and the second electrode, the first part conductor being connected to the first electrode; and
      a second part conductor which is disposed between the support beam and the third electrode, the second part conductor being connected to the first electrode.

7. The resonant transducer according to claim 6, wherein the first part conductor is formed to surround the second electrode, the first support beam, and the resonant beam.

8. The resonant transducer according to claim 6, wherein the second part conductor is formed to surround the third electrode, the second support beam, and the resonant beam.

9. The resonant transducer according to claim 1, wherein a cross section of the resonant beam which is perpendicular to the semiconductor substrate is larger than a cross section which is parallel to the semiconductor substrate.

10. The resonant transducer according to claim 1, wherein a longitudinal width of the resonant beam is at least three times longer than a lateral width of the resonant beam.

11. The resonant transducer according to claim 1, further comprising:
    a vacuum chamber which is formed in the semiconductor substrate, the vacuum chamber being partitioned into a predetermined shape; and
    a first layer which covers the vacuum chamber,
    wherein the resonant beam is disposed in the vacuum chamber, and
    wherein a through hole is formed in the first layer immediately above the resonant beam.

12. The resonant transducer according to claim 11,
    wherein the through hole is blocked by a blocking member, and
    wherein the resonant transducer further comprises a second layer which covers the through hole.

13. A resonant transducer comprising:
    a resonant beam which is formed on a semiconductor substrate;
    a support beam of which one end is connected to a part of the resonant beam at a predetermined angle;
    a first electrode which is connected to the resonant beam via the support beam;
    a second electrode which is disposed adjacent to a center of one side surface of the resonant beam; and
    a conductor which is disposed between the support beam and the second electrode, the conductor being connected to the first electrode,
    wherein the support beam comprises:
       a first support beam which is connected to one side surface of one end of the resonant beam at a predetermined angle; and
       a second support beam which is connected to the other side surface of one end of the resonant beam at a predetermined angle,
    wherein a third electrode is formed adjacent to a center of the other side surface of the resonant beam,
    wherein the conductor comprises:
       a first part conductor which is disposed between the support beam and the second electrode, the first part conductor being connected to the first electrode; and
       a second part conductor which is disposed between the support beam and the third electrode, the second part conductor being connected to the first electrode, wherein the support beam further comprises:
- a third support beam which is connected to one side surface of the other end of the resonant beam at a predetermined angle; and
- a fourth support beam which is connected to the other side surface of the other end of the resonant beam at a predetermined angle, wherein the conductor further comprises:
- a third part conductor which is disposed between the third support beam and the second electrode, the third part conductor being connected to the first electrode, and
- a fourth part conductor which is disposed between the fourth support beam and the third electrode, the fourth part conductor being connected to the first electrode, wherein a vertical length of the resonant beam is longer than a horizontal length of the resonant beam, both ends of the resonant beam are supported, and the resonant beam resonates along an intra-surface direction of the semiconductor substrate, and wherein a first connection point at which the first support beam is connected to the semiconductor substrate, a second connection point at which the second support beam is connected to the semiconductor substrate, and a third connection point at which the first support beam and the second support beam are connected to the resonant beam are not aligned in a straight line.

14. The resonant transducer according to claim 1,
wherein the resonant beam, the support beam, the first electrode, and the second electrode are formed on the same surface as each other,
wherein impurities are diffused in the resonant beam and the support beam respectively, and
wherein the resonant transducer comprises a drive circuit which causes the resonant beam to resonate along the intra-surface direction.

15. The resonant transducer according to claim 13, wherein the third part conductor is formed to surround the second electrode, the third support beam, and the resonant beam.

16. The resonant transducer according to claim 13, wherein the fourth part conductor is formed to surround the third electrode, the fourth support beam, and the resonant beam.

17. The resonant transducer according to claim 13, further comprising:
- a first pad which is connected to the first support beam;
- a second pad which is connected to the second support beam;
- a third pad which is connected to the third support beam;
- a fourth pad which is connected to the fourth support beam; and
- an electrode terminal which is connected to a bias power supply, wherein the fourth pad is connected to the electrode terminal.

18. The resonant transducer according to claim 17,
wherein the first pad, the first support beam, the second pad, the second support beam, the resonant beam, the third pad, the third support beam, the fourth pad, the fourth support beam, and the electrode terminal are the same electrical potential as each other.

19. The resonant transducer according to claim 17,
wherein the first electrode surrounds the first pad, the first support beam, the second pad, the second support beam, the third pad, the third support beam, the fourth pad, the fourth support beam, the second electrode, and the third electrode.

20. A resonant transducer comprising:
- a resonant beam which is formed on a semiconductor substrate, both ends of the resonant beam being supported;
- a support beam of which one end is connected to a part of the resonant beam at a predetermined angle;
- a first electrode which is connected to the resonant beam via the support beam;
- a second electrode which is disposed adjacent to a center of one side surface of the resonant beam;
- a conductor which is disposed between the support beam and the second electrode, the conductor being connected to a stable potential body;
- a drive circuit which is connected to the second electrode and excites the resonant beam; and
- a resonant detector configured to detect resonance of the resonant beam, wherein a longitudinal direction of the resonant beam and a longitudinal direction of the support beam form an acute angle or an obtuse angle, wherein a vertical length of the resonant beam is longer than a horizontal length of the resonant beam, both ends of the resonant beam are supported, and the resonant beam resonates along an intra-surface direction of the semiconductor substrate, wherein the support beam comprises:
- a first support beam of which one end is connected to one side surface of one end of the resonant beam at a predetermined angle, another end of the first support beam being connected to the semiconductor substrate at a predetermined angle; and
- a second support beam of which one end is connected to another side surface of the one end of the resonant beam at a predetermined angle, and wherein a first connection point at which the first support beam is connected to the semiconductor substrate, a second connection point at which the second support beam is connected to the semiconductor substrate, and a third connection point at which the first support beam and the second support beam are connected to the resonant beam are not aligned in a straight line.

* * * * *